(12) United States Patent
Kuwana et al.

(10) Patent No.: US 8,410,817 B2
(45) Date of Patent: Apr. 2, 2013

(54) DRIVER CIRCUIT

(75) Inventors: Yuji Kuwana, Tokyo (JP); Naoki Matsumoto, Tokyo (JP); Yasuhiro Urabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 205 days.

(21) Appl. No.: 12/858,295

(22) Filed: Aug. 17, 2010

(65) Prior Publication Data

US 2011/0043250 A1 Feb. 24, 2011

(30) Foreign Application Priority Data

Aug. 19, 2009 (JP) ................. 2009-189967

(51) Int. Cl.
*H03K 19/0175* (2006.01)
*H03B 1/00* (2006.01)

(52) U.S. Cl. ............. 326/82; 326/86; 327/108; 327/109

(58) Field of Classification Search ............... 326/62–63, 326/68, 80–87; 327/108, 109
See application file for complete search history.

(56) References Cited

U.S. PATENT DOCUMENTS

| | | | | |
|---|---|---|---|---|
| 6,218,820 | B1 * | 4/2001 | D'Arrigo et al. | 323/285 |
| 7,274,232 | B2 * | 9/2007 | Lin et al. | 327/158 |
| 7,388,407 | B2 * | 6/2008 | Lin et al. | 327/262 |
| 2004/0125905 | A1 * | 7/2004 | Vlasenko et al. | 375/376 |
| 2007/0098027 | A1 * | 5/2007 | Saitoh et al. | 372/29.011 |
| 2008/0089459 | A1 * | 4/2008 | Vlasenko et al. | 375/376 |
| 2009/0195231 | A1 * | 8/2009 | Noon et al. | 323/282 |

* cited by examiner

*Primary Examiner* — Thienvu Tran
(74) *Attorney, Agent, or Firm* — Ladas & Parry, LLP

(57) ABSTRACT

A level switch circuit receives a digital input signal, and generates a level signal having a voltage level that corresponds to the value of the input signal thus received. A buffer circuit receives a level signal, and outputs the level signal via an output terminal thereof. A bias current generating circuit generates a bias current including a DC component having a constant level and a variable component that changes according to the input signal, and supplies the bias current thus generated to a buffer circuit. The bias current generating circuit detects an edge of the input signal, and raises the bias current by a predetermined amount for a predetermined period of time after the edge thus detected.

12 Claims, 8 Drawing Sheets

DRIVER CIRCUIT

CROSS-REFERENCE TO RELATED APPLICATIONS

This application claims priority to Japanese Patent Application No. 2009-189967 filed on Aug. 19, 2009, the disclosure of which is incorporated herein by reference in its entirety.

BACKGROUND OF THE INVENTION

1. Field of the Invention

The present invention relates to a driver circuit configured to transmit an electric signal.

2. Description of the Related Art

In order to transmit pulse signals, or signals similar to pulse signals, to a separate circuit via a propagation path, a driver circuit is employed. In recent years, with improved high-speed semiconductor devices, such driver circuits are also required to perform high-speed operations. In order to improve the operation speed of such driver circuits, various approaches have been proposed as follows.

FIGS. 1A and 1B are a circuit diagram showing an example configuration of a high-speed driver circuit and a time chart showing the operation thereof, respectively.

A driver circuit 200 shown in FIG. 1A includes a transistor Q1, a constant current circuit 202, and a capacitor C1. A capacitor C2 represents a parasitic capacitance of the emitter of the transistor Q1 and a parasitic capacitance of a wiring line.

The transistor Q1 and the constant current circuit 202 form a so-called emitter follower circuit. The transistor Q1 is configured as an NPN bipolar transistor, and the capacitor C1 is arranged between the base of the transistor Q1 and the emitter thereof. It should be noted that the transistor Q1 may be configured as a PNP bipolar transistor. Alternatively, the transistor Q1 may be configured as an N-channel FET (Field Effect Transistor) or a P-channel FET.

In order to enable such a driver circuit (emitter follower) 200 to perform high-speed operations, the constant current circuit 202 should be designed to generate a large current I2. However, this increases constant current consumption, which is undesirable. Accordingly, the capacitor C1 is arranged in order to suppress current consumption while improving the slew rate.

Starting from the top and in the following order, the waveform diagrams shown in FIG. 1B illustrate: the input voltage Vin, the output voltage Vout, and the charge/discharge current I1 that flows to/from the capacitor C1. In the waveform diagram of the output voltage Vout, the dotted line represents the waveform of the output voltage Vout in a case in which the capacitor C1 is not provided, and the solid line represents the waveform of the output voltage Vout in a case in which the capacitor C1 is provided. Such an arrangement employing the capacitor C1 as an additional component allows the charge stored in the capacitor C2 to be discharged via the capacitor C1, in addition to the constant current circuit 202. Thus, such an arrangement provides the improved slew rate.

However, in order to provide a capacitor C1 having high speed charging and discharging, there is a need to provide a circuit having high driving power (low output impedance) as an upstream component of the driver circuit 200, leading to reduction in the range of application.

FIGS. 2A and 2B are a circuit diagram showing another example configuration of a high-speed driver circuit and a time chart showing the operation thereof, respectively.

A driver circuit 300 shown in FIG. 2A includes a transistor Q2, a constant current circuit 302, and a capacitor C3. A capacitor C4 represents a parasitic capacitance that occurs at the transistors Q2 and Q3, the wiring lines, and so forth.

A constant current circuit 302 is configured as a so-called current mirror circuit. The current mirror circuit includes transistors Q3 and Q4, and resistors R1 and R2. A constant current Ic is supplied to the input side of the current mirror circuit, and a current I4 is output from the output side thereof.

A capacitor C3 is arranged between an input terminal $P_{in}$ of the driver circuit 300 and a connection node that connects the transistor Q4 and the resistor R1.

Starting from the top and in the following order, the waveform diagrams shown in FIG. 2B illustrate: the input voltage Vin, the output voltage Vout, the charge/discharge current I3 that flows to/from the capacitor C3, and the output current I4 of the constant current circuit 302. In the waveform diagram of the output voltage Vout, the dotted line represents the output voltage Vout in a case in which the capacitor C3 is not provided, and the solid line represents the output voltage Vout in a case in which the capacitor C3 is provided. Such an arrangement employing the capacitor C3 as an additional component improves the slew rate. Furthermore, the voltage change that occurs at the resistor R1 due to the current component that flows through the capacitor C3 is superimposed on the emitter voltage V1. Thus, such an arrangement can provide a large change in the output current I4 of the constant current circuit 302.

However, if the emitter voltage V1 of the transistor Q4 is greater than the base voltage thereof, the current change speed is reduced. Accordingly, the maximum value of the output current I4 is limited to twice the value of the state (steady state) when there is no edge (level transition). This leads to a problem in that a limit is placed on the slew rate.

SUMMARY OF THE INVENTION

The present invention has been made in view of such a situation. Accordingly, it is an exemplary purpose of an embodiment of the present invention to provide a driver circuit which is capable of performing high-speed operations.

An embodiment of the present invention relates to a driver circuit. The driver circuit comprises: a level switch circuit configured to receive a digital input signal, and to generate a level signal having a voltage level that corresponds to the value of the aforementioned input signal; a buffer circuit configured to receive the level signal, and to output the level signal thus received; and a bias current generating circuit configured to generate a bias current including a DC component having a constant level and a variable component that changes according to the input signal, and to supply the bias current thus generated to the buffer circuit.

With such an embodiment, when a level transition occurs, a bias current is raised in a transient manner. Thus, such an arrangement improves the slew rate while suppressing current consumption when no level transition occurs.

Also, the bias current generating circuit may detect an edge in the input signal, and may raise the bias current by a predetermined amount for a predetermined period of time after the edge thus detected.

By means of such edge detection, such an arrangement is capable of appropriately detecting the timing of a level transition, i.e., the timing at which the bias current is to be raised.

Also, the bias current generating circuit may comprise: a DC bias current source configured to generate the DC component; an edge detection circuit configured to detect an edge in the input signal, and to generate a variable signal which is asserted for a predetermined period of time after the edge thus detected; a pulse current generating circuit configured to convert the variable signal into a current, thereby generating the variable component; and a current combining unit configured to combine the variable component and the DC component.

Also, the buffer circuit may comprise an emitter follower push-pull output stage including an NPN high-side transistor and a PNP low-side transistor. Also, the bias current generating circuit may be configured to raise the bias current to be supplied to a base of the high-side transistor by a predetermined amount for a predetermined period of time after a positive edge in the input signal, and to raise the bias current to be supplied to a base of the low-side transistor by a predetermined amount for a predetermined period of time after a negative edge in the input signal.

By independently controlling the bias current to be supplied to the high-side transistor and the bias current to be supplied to the low-side transistor, such an arrangement further reduces current consumption of the driver circuit.

Also, the bias current generating circuit may comprise: a DC bias current source configured to generate the DC component; a first edge detection circuit configured to detect a positive edge of the input signal, and to generate a first variable signal which is asserted for a predetermined first period after the positive edge thus detected; a first pulse current generating circuit configured to convert the first variable signal into a current, thereby generating a first variable component; a first current combining unit configured to combine the first variable component and the DC component; a second edge detection circuit configured to detect a negative edge of the input signal, and to generate a second variable signal which is asserted for a predetermined second period after the negative edge thus detected; a second pulse current generating circuit configured to convert the second variable signal into a current, thereby generating a second variable component; and a second current combining unit configured to combine the second variable component and the DC component.

Also, the buffer circuit may comprise: an emitter follower push-pull output stage including an NPN high-side transistor and a PNP low-side transistor; a first control transistor arranged between a base of the high-side transistor and a lower fixed voltage; a second control transistor arranged between a base of the low-side transistor and an upper fixed voltage. Also, the buffer circuit may be configured to be switchable to a high-impedance state by turning on both the first and second control transistors. Also, the driver circuit may be configured to monitor an enable signal which is used for switching the high-impedance state, and to change the currents that flow through the first and second control transistors upon detection of an edge in the enable signal.

Also, the bias current generating circuit may be configured to detect a state in which the input signal exhibits a constant value, and thereby to generate the variable component.

The "driver circuit" described in the present specification is a broad concept which also includes comparators and operational amplifiers, which are also encompassed in the technical scope of the present invention.

Another embodiment of the present invention relates to a test apparatus. The test apparatus comprises: a pattern generator configured to generate a pattern signal to be supplied to a device under test; and a driver circuit according to any one of the above-described embodiments, configured to receive the pattern signal, and to output the pattern signal thus received to the device under test.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 3:
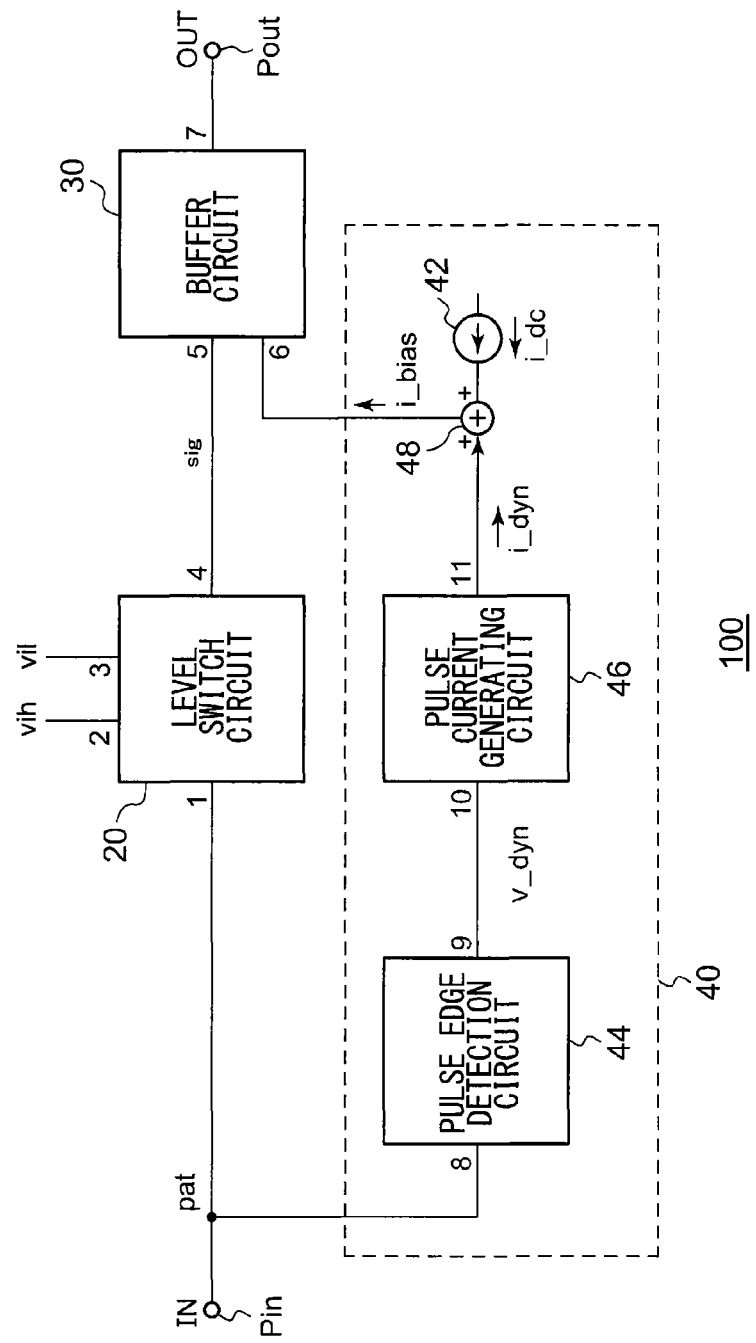
FIG. 3 is a block diagram which shows a configuration of a driver circuit according to an embodiment.

FIG. 3 is a block diagram which shows a configuration of a driver circuit 100 according to an embodiment. The driver circuit 100 includes a level switch circuit 20, a buffer circuit 30, and a bias current generating circuit 40.

The driver circuit 100 receives a digital input signal IN via an input terminal Pin thereof, and outputs an output signal OUT having a voltage level that corresponds to the value of the input signal IN. For example, the driver circuit 100 is configured as a binary driver. When the input signal IN is low level (0), the output signal OUT is set to a first level Vih. When the input signal IN is high level (1), the output signal OUT is set to a second level vil. It should be noted that the present invention is not restricted to such a driver configured as a binary driver. Also, the present invention can be applied to a driver configured as a three (or more) valued driver.

The level switch circuit 20 receives the input signal IN via an input terminal 1, and receives a first level voltage vih and a second level voltage vil via respectively a second terminal 2 and a third terminal 3. When "0" is input to the input terminal 1, the level switch circuit 20 outputs vil. When "1" is input to the input terminal 1, the level switch circuit 20 outputs vih. The level switch circuit 20 can be understood to be a one-bit D/A converter.

The buffer circuit 30 receives a level signal sig via a terminal 5 thereof, performs current amplification of the level signal sig thus received, and outputs the resulting level signal sig via a terminal 7 thereof.

The bias current generating circuit 40 generates a bias current i_bias including a DC component i_dc having a constant level and a variable component i_dyn that changes according to the input signal, and supplies the resulting bias current i_bias to the buffer circuit 30.

The bias current generating circuit 40 detects an edge in the input signal IN, and raises the bias current i_bias by a predetermined amount for a predetermined period of time after the edge.

The bias current generating circuit 40 includes a DC bias current source 42, a pulse edge detection circuit 44, a pulse current generating circuit 46, and a current combining unit 48. The DC bias current source 42 generates a DC current component i_dc which exhibits a constant value.

The pulse edge detection circuit 44 receives the input signal IN via its terminal 8, and detects an edge thereof. The pulse edge detection circuit 44 generates a variable signal v_dyn which is asserted for a predetermined period of time after every detection of an edge. That is to say, the variable signal v_dyn is generated as a pulse-shaped signal. Either the positive edge (which will also be referred to as the "leading edge" or the "rising edge") or the negative edge (which will also be referred to as the "trailing edge" or the "falling edge") is detected, or otherwise both edges are detected.

Description will be made below regarding an arrangement in which the positive edge and the negative edge are both detected. The predetermined period of time that corresponds to the positive edge will be referred to as the "first period Tr", and the predetermined period of time that corresponds to the negative edge will be referred to as the "second period Tf".

The first period Tr is preferably set to a transition period equivalent to the positive edge transition time of the level signal sig, and the second period Tf is preferably set to a transition period equivalent to the negative edge transition time of the level signal sig. With such an arrangement, the slew rate can only increase during a transition period, and current consumption is suppressed during other periods.

It should be noted that the first period Tr and the second period Tf may be optimized by experiment or by simulation, regardless of the transition period of the level switch circuit 20.

The pulse current generating circuit 46 converts the variable signal v_dyn into a current, thereby generating a pulse-shaped variable component i_dyn. For example, the pulse current generating circuit 46 may include a current source configured to generate a predetermined current, and a switch configured to cut off or pass the current. By turning on and off the switch according to the variable signal v_dyn, such an arrangement is capable of generating a pulse-shaped variable component i_dyn.

The current combining unit 48 combines the variable component i_dyn and the DC component i_dc. In a most simple configuration, the current combining unit 48 can be configured as a wiring line which combines two current signals into a single current signal.

Figure 4:
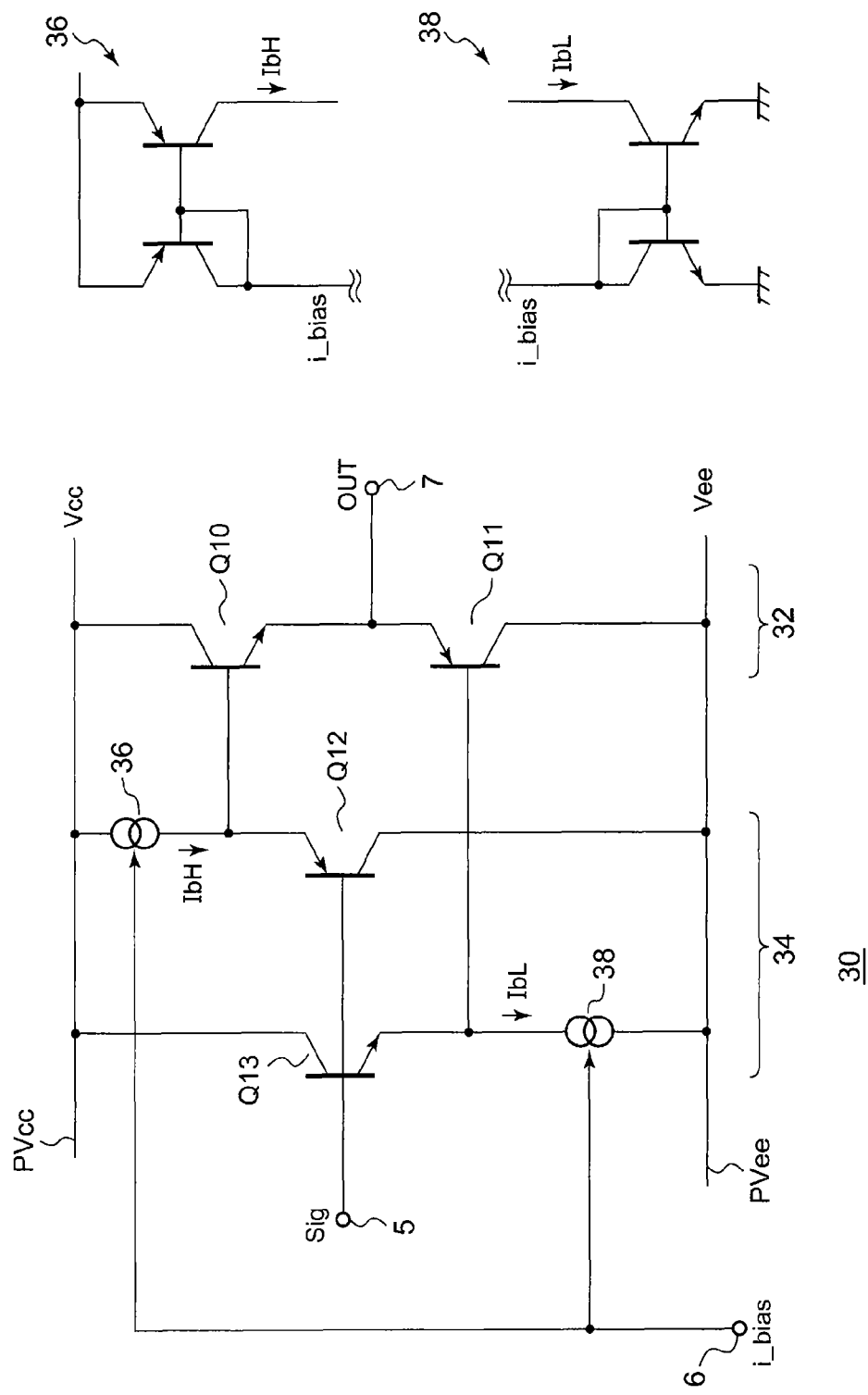
FIG. 4 is a circuit diagram which shows an example configuration of a buffer circuit shown in FIG. 3.

FIG. 4 is a circuit diagram which shows an example configuration of the buffer circuit 30 shown in FIG. 3. The buffer circuit 30 includes an emitter-follower push-pull output stage 32 and an emitter-follower input stage 34.

The output stage 32 includes a high-side transistor Q10 and a low-side transistor Q11. The high-side transistor Q10 and the low-side transistor Q11 are configured respectively as an NPN bipolar transistor and a PNP bipolar transistor. The high-side transistor Q10 and the low-side transistor Q11 are connected in series between a first fixed voltage terminal PVcc to which a first fixed voltage Vcc is applied and a second fixed voltage terminal PVee to which a second fixed voltage Vee is applied. The emitters of the high-side transistor Q10 and the low-side transistor Q11 function as the output terminal 7 of the buffer circuit 30.

The input stage 34 includes input transistors Q12 and Q13 and bias current sources 36 and 38. The input transistors Q12 and Q13 are configured respectively as a PNP bipolar transistor and an NPN bipolar transistor. The bases of the transistors Q12 and Q13 are each connected to the input terminal 5 of the buffer circuit 30. The emitter of the transistor Q12 and the emitter of the transistor Q13 are connected respectively to the base of the high-side transistor Q10 and to the base of the low-side transistor Q11.

The first bias current source 36 is arranged between the emitter of the input transistor Q12 and the first fixed voltage terminal PVcc, and generates a base bias current IbH for the high-side transistor Q10. The second bias current source 38 is arranged between the emitter of the input transistor Q13 and the second fixed voltage terminal PVee, and generates a base bias current IbL for the low-side transistor Q11.

The bias currents IbH and IbL, generated by respectively the first bias current source 36 and the second bias current source 38, are controlled according to the bias current i_bias which is input to a bias control terminal 6. More specifically, the bias currents IbH and IbL are each generated in proportion to the bias current i_bias. The first bias current source 36 and the second bias current source 38 may be each configured as a current mirror circuit as shown on the right in FIG. 4.

The input terminal 5 is coupled to the output terminal 7 via a first path that includes the base-emitter paths of the input transistor Q12 and the high-side transistor Q10, or a second path that includes the base-emitter paths of the input transistor Q13 and the low-side transistor Q11. Thus, the electric potential at the input terminal 5 is substantially the same as that at the output terminal 7.

Figure 1A:
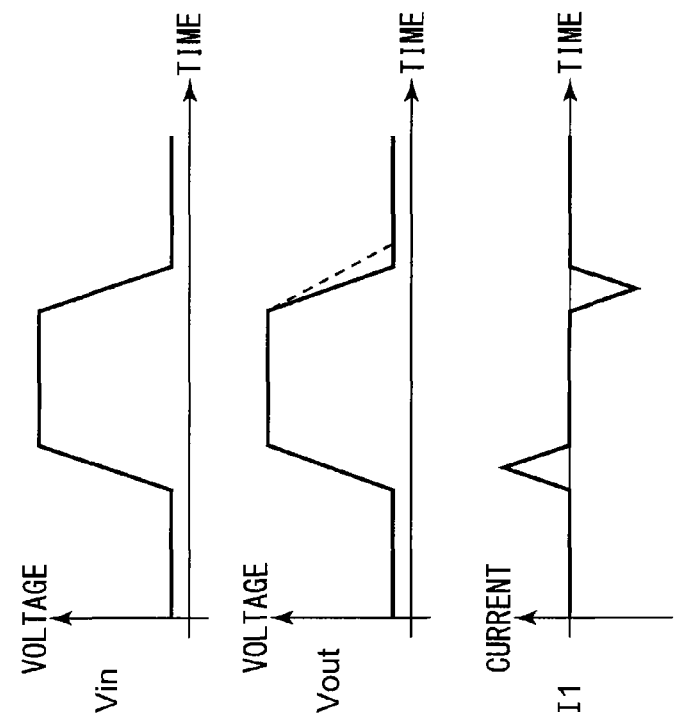
FIGS. 1A and 1B are a circuit diagram showing an example configuration of a high-speed driver circuit and a time chart showing the operation thereof, respectively.
Figure 1B:
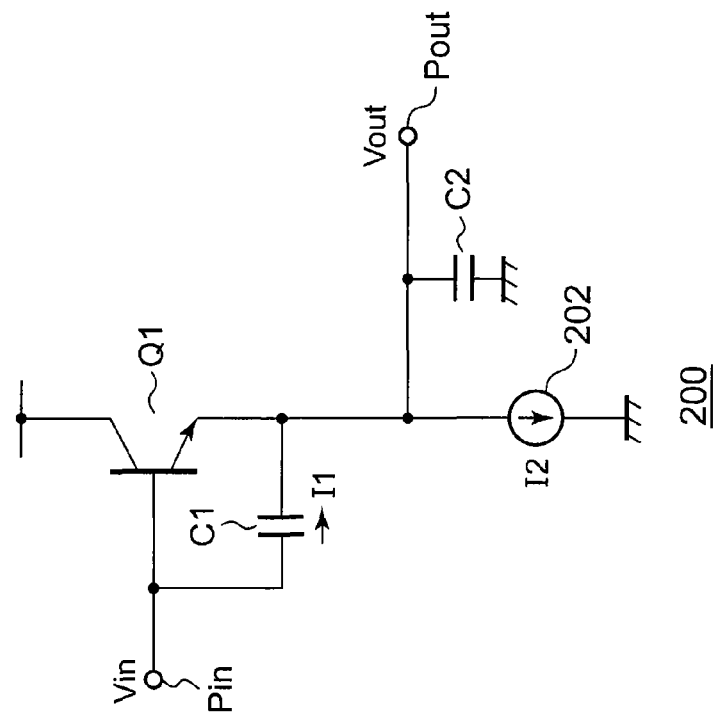
Figure 2B:
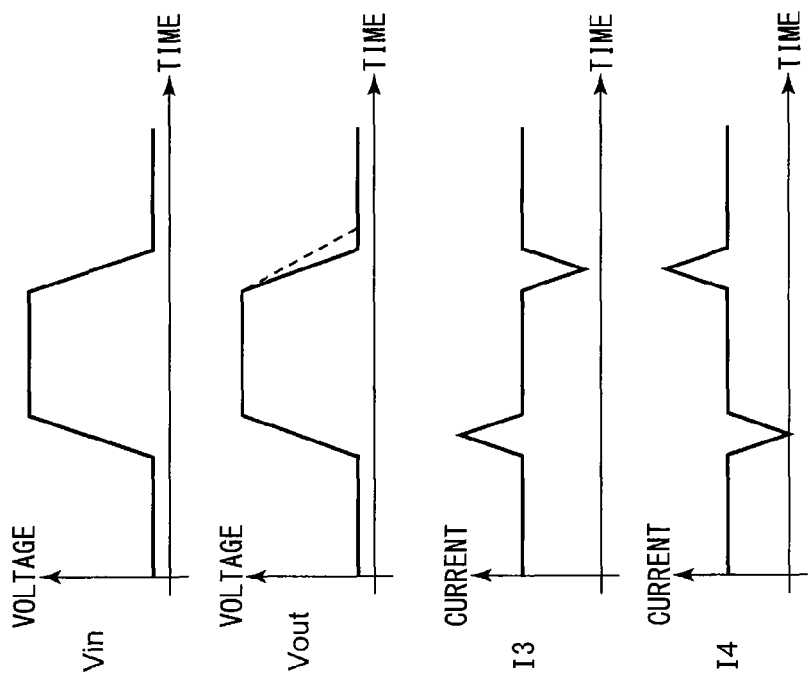
FIGS. 2A and 2B are a circuit diagram showing another example configuration of a high-speed driver circuit and a time chart showing the operation thereof, respectively.
Figure 2A:
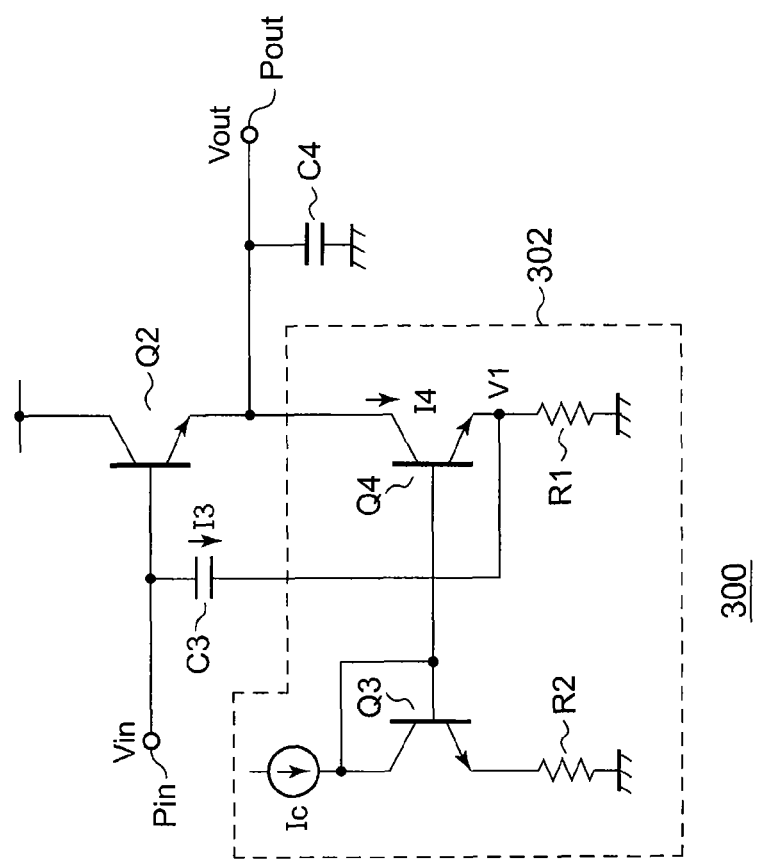
Figure 5:
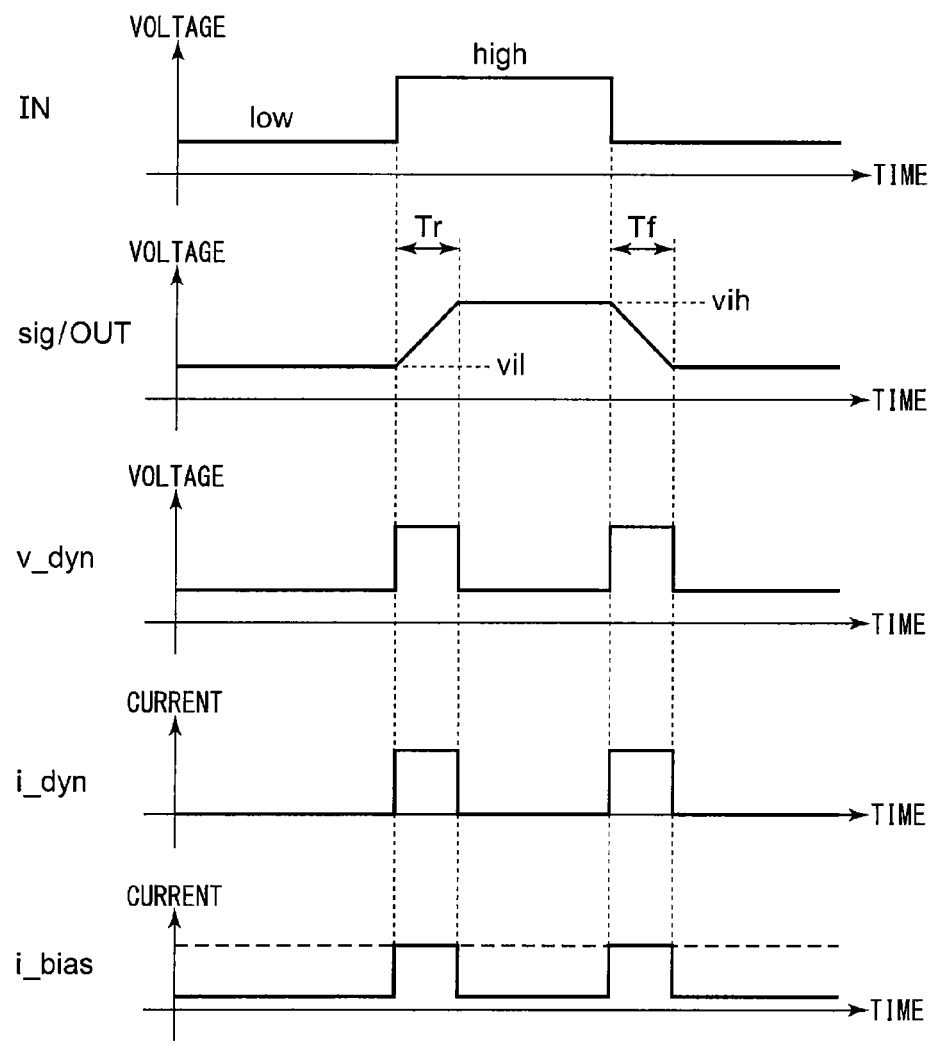
FIG. 5 is a time chart which shows the operation of a driver circuit shown in FIG. 3.

The above is the configuration of the driver circuit 100. Next, description will be made regarding the operation thereof. FIG. 5 shows time charts illustrating the operation of the driver circuit 100 shown in FIG. 3. The time charts shown in FIG. 2B illustrate, in the following order from the top, the input voltage IN, the level signal sig and the output signal OUT, the variable signal v_dyn, the variable current i_dyn, and the bias current i_bias.

The level signal sig generated by the level switch circuit 20 transits with a predetermined transition time Tr or Tf. The pulse edge detection circuit 44 generates the pulse signal v_dyn which is asserted (set to high level) for the first period Tr starting from the positive edge timing of the input signal IN and which is asserted for the second period Tf starting from the negative edge timing of the input signal IN.

The pulse current generating circuit 46 converts the variable signal v_dyn into a current. As a result, the variable current i_dyn is generated, the level of which increases in increments of edges detected in the input signal IN, up to a certain level. By combining the variable current i_dyn and the DC component i_dc, such an arrangement generates the bias current i_bias.

That is to say, the bias current i_bias increases for a short period of time with each transition in the input signal IN. As a result, the operation speed of the buffer circuit 30 is boosted. Thus, such an arrangement enables the output signal OUT to be switched with high speed according to the level signal sig.

Furthermore, the bias current i_bias is reduced to the level of the DC component i_dc during a period of time in which the input signal IN exhibits a constant level. Thus, such an arrangement reduces current consumption.

Figure 6:
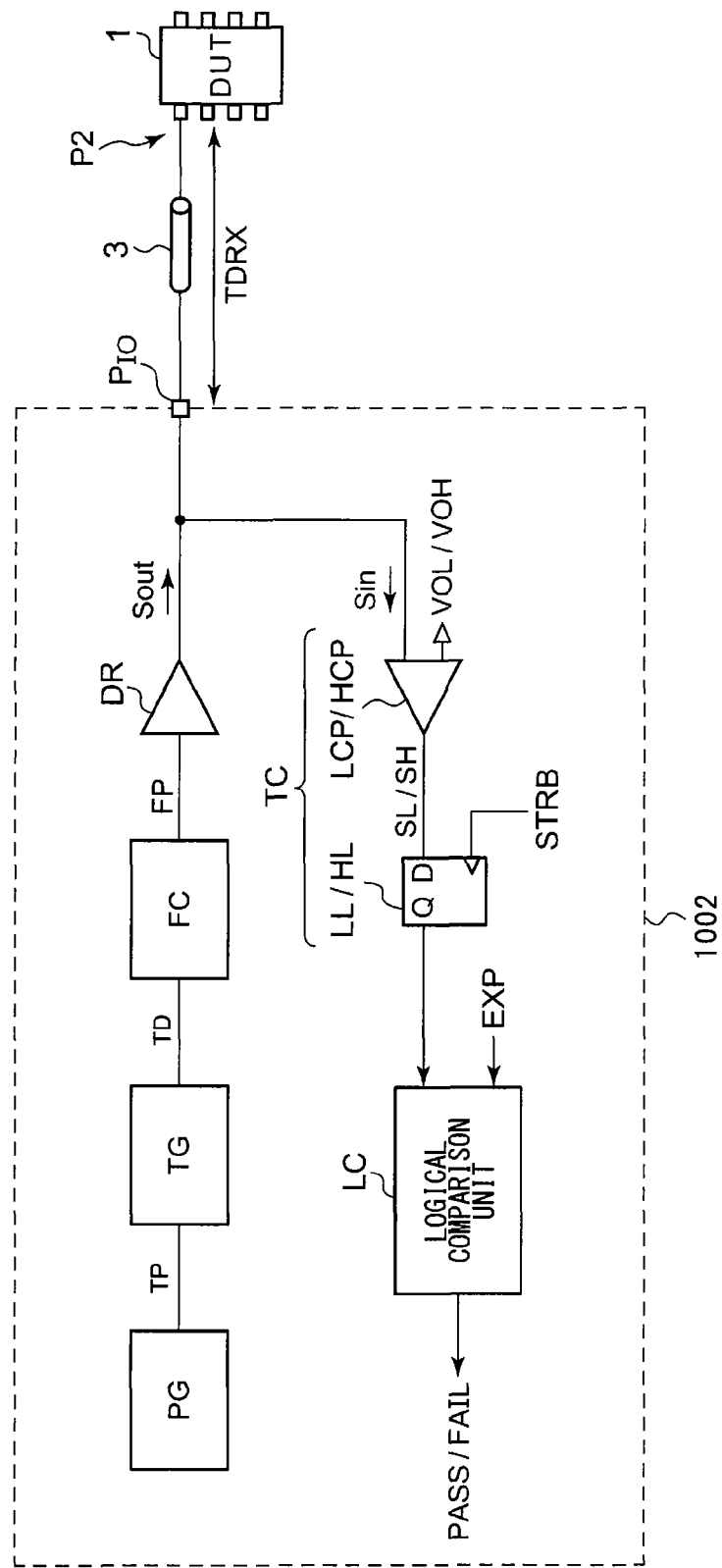
FIG. 6 is a block diagram which shows a configuration of a test apparatus including a driver circuit according to an embodiment.

Next, description will be made regarding an application of the driver circuit 100 according to an embodiment. FIG. 6 is a block diagram which shows a test apparatus 1002 including the driver circuit 100 according to an embodiment.

The test apparatus 1002 mainly includes a pattern generator PG, a timing generator TG, a waveform shaper FC, a driver DR, a timing comparator TC, and a logical comparison unit LC.

The pattern generator PG generates a data sequence (test pattern TP) to be supplied to the DUT 1, in increments of data cycles TRATE. According to the test pattern TP, the timing generator TG generates timing setting data TD, which is used to set the timings of the positive edge and the negative edge in the output signal Sout to be supplied to a DUT 1.

The waveform shaper FC receives the timing setting data TD, and generates an output signal FP, the value of which changes at a timing that corresponds to the timing setting data TD thus received. The driver DR outputs the output signal Sout to the DUT 1 via a terminal PIO.

The timing comparator TC receives a signal Sin output from the DUT 1, and latches the value of the signal Sin at a predetermined timing. For example, the timing comparator TC includes a pair comprising a level comparator LCP and a latch LL and a pair comprising a level comparator HCP and a latch HL. The level comparator LCP compares the signal Sin received from the DUT 1 with a lower threshold voltage VOL, and generates an SL signal which is set to high level (1) when Sin<VOL. The latch LL latches the SL signal at an edge timing of a strobe signal STRB. Furthermore, the level comparator HCP compares the signal Sin received from the DUT with an upper threshold voltage VOH, and generates an SH signal which is set to high level (1) when Sin>VOH. The latch HL latches the SH signal at a timing provided by the strobe signal STRB.

The logical comparison unit LC compares the output signal Q of the latch LL (HL) with the corresponding expected value EXP in increments of test cycles, and generates a pass/fail signal PASS/FAIL which indicates whether the output signal Q matches the corresponding expected value.

The driver circuit 100 shown in FIG. 3 is suitably employed as the driver DR included in the test apparatus 1002.

Also, the technique of the driver circuit shown in FIG. 3 may be applied to the level comparator LCP or HCP included in the timing comparator TC. With such an arrangement, the bias current supplied to the output stage buffer of the comparator should be controlled according to the level of the input signal Sin.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made regarding the bias current generating circuit 40 with reference to FIG. 3, which is configured such that the bias currents IbH and IbL are both raised during the positive edge and the negative edge transition periods. In contrast, with a first modification, the bias currents IbH and Ibl are boosted independently.

Specifically, the bias current IbH to be supplied to the base of the high-side transistor Q10 is raised by a predetermined amount from the DC component i_dc for a predetermined period Tr after a positive edge in the input signal IN. Furthermore, the bias current IbL to be supplied to the base of the low-side transistor Q11 is raised by a predetermined amount from the DC component i_dc for a predetermined period Tr after a negative edge in the input signal IN.

Figure 7:
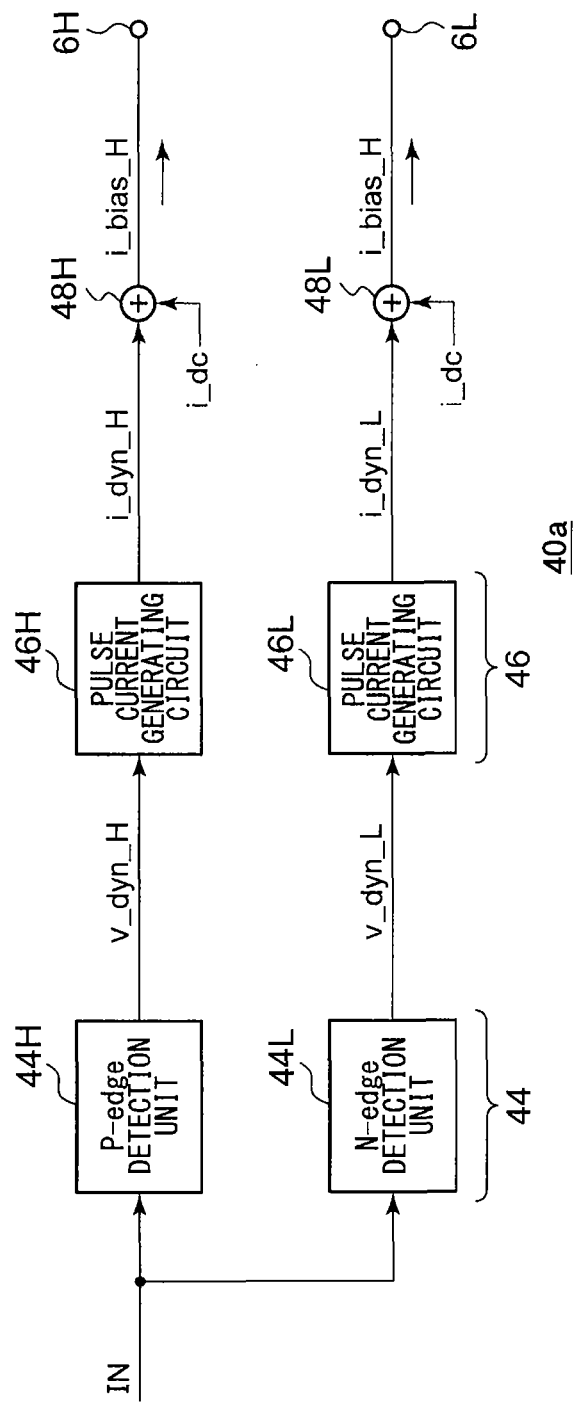
FIG. 7 is a block diagram which shows a configuration of a bias current generating circuit which can be employed in a driver circuit according to a first modification.

FIG. 7 is a block diagram which shows a configuration of a bias current generating circuit 40a which can be employed in the driver circuit according to the first modification.

The bias current generating circuit 40a includes a first edge detection circuit 44H, a second edge detection circuit 44L, a first pulse current generating circuit 46H, a second pulse current generating circuit 46L, a first current combining unit 48H, a second current combining unit 48L, and an unshown DC bias current source.

The first edge detection circuit 44H detects a positive edge in the input signal IN, and generates a first variable signal v_dyn_H which is asserted for a predetermined first period Tr after the positive edge. The second edge detection circuit 44L detects a negative edge in the input signal IN, and generates a second variable signal v_dyn_L which is asserted for a predetermined second period Tf after the negative edge.

The first pulse current generating circuit 46H and the second pulse current generating circuit 46L convert respectively the first variable signal v_dyn_H and the second variable signal v_dyn_L into current signals, thereby generating a first variable component i_dyn H and a second variable component i_dyn_L. The first current combining unit 48H and the second current combining unit 48L add the DC bias component i_dc to respectively the variable component i_dyn_H and the variable component i_dyn_L. The first bias current i_bias_H is supplied to the first bias current source 36 shown in FIG. 4, and the second bias current i_bias_L is supplied to the second bias current source 38 shown in FIG. 4.

With the first modification, when a positive edge transition occurs in the input signal IN, only the bias current IbH supplied by the first bias current source 36 is boosted. When a negative edge transition occurs in the input signal IN, only the bias current IbL supplied by the second bias current source 38 is boosted. As a result, such an arrangement is capable of further reducing the circuit current as compared with the configuration shown in FIG. 3.

[Second Modification]

A driver circuit according to a second modification is configured to be switchable between a first state in which the voltage to be output is switched between multiple voltages (vil, vih) according to the input signal IN and a second state in which the driver circuit functions as a termination amplifier which outputs a fixed termination voltage Vt. The driver circuit receives the input signal IN and a control signal dre as input signals. When the control signal dre is asserted, the driver circuit is set to the first state, and when the control signal dre is negated, the driver circuit is set to the second state.

The basic block diagram which shows the driver circuit according to the second modification is the same as that shown in FIG. 3. A bias current generating circuit 40b monitors the control signal dre, in addition to the input signal IN, and detects an edge of the control signal dre. When the bias current generating circuit 40b detects an edge in the control signal dre, the bias current generating circuit 40b raises the bias current that flows through the buffer circuit. The driver circuit should be designed such that, when the state is switched between the first state and the second state, which of the first bias current source 36 or the second bias current source 38 is to be boosted is determined based upon the magnitude relation between the termination voltage Vt and the multiple voltages vih and vil. In a most simple configuration, both the currents should be boosted.

[Third Modification]

A driver circuit according to a third modification is configured to be switchable between a first state in which the voltage to be output is switched between multiple voltages (vil, vih) according to the input signal IN and a high-impedance state. When the control signal (enable signal) dre is asserted (set to high level), the driver circuit is set to the first state, and when the control signal dre is negated, the driver circuit is set to the high-impedance state. In the high-impedance state, both the high-side transistor and the low-side transistor configured as the output stage of the buffer circuit are turned off.

Figure 8:
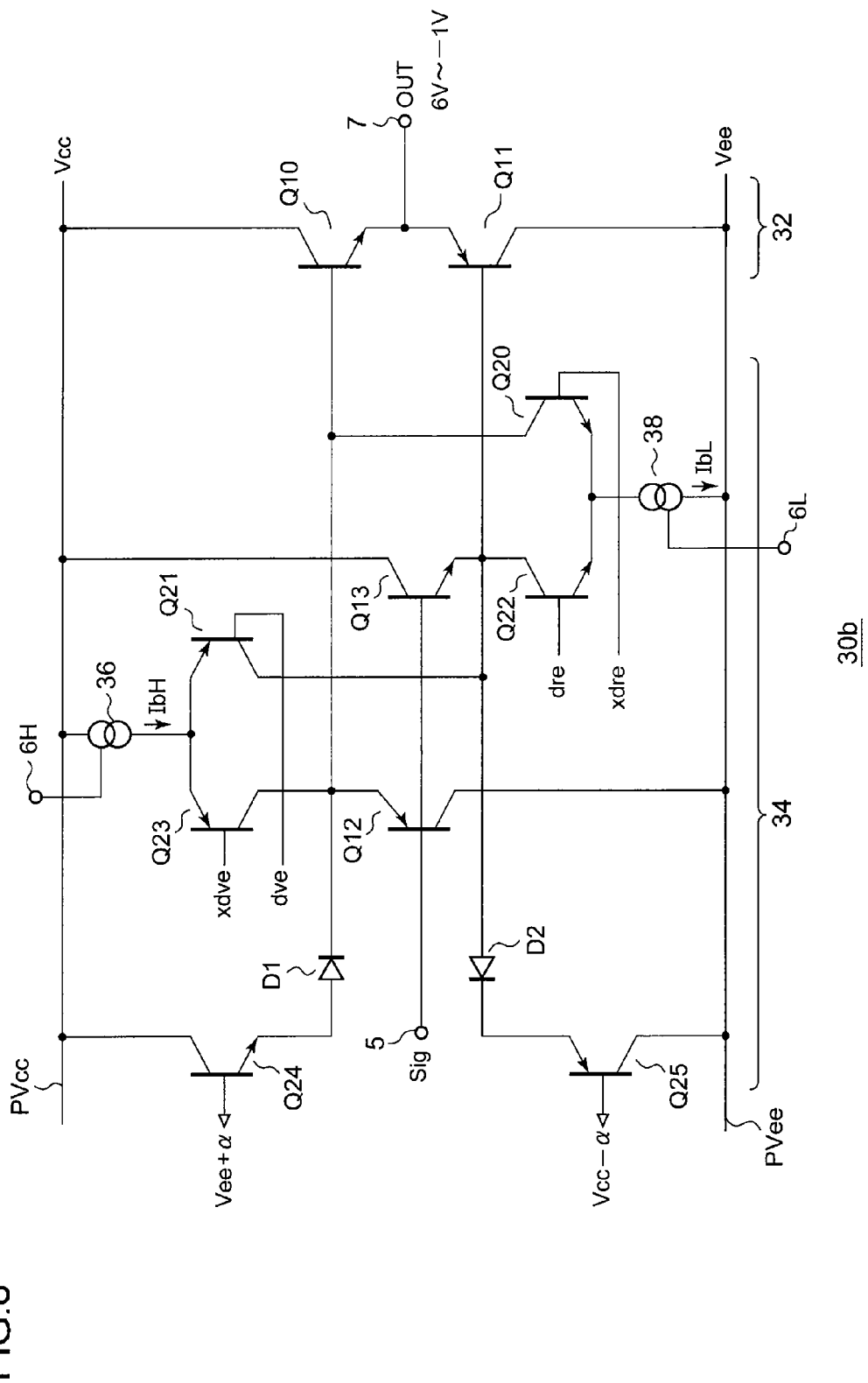
FIG. 8 is a circuit diagram which shows a configuration of a buffer circuit according to a second modification.

FIG. 8 is a circuit diagram which shows a configuration of a buffer circuit according to a second modification. A buffer circuit 30b shown in FIG. 8 further includes control transistors Q20 through Q23, transistors Q24 and Q25, and diode D1 and D2, in addition to the components of the buffer circuit shown in FIG. 4.

The control transistor Q20 is arranged in series with the second bias current source 38 between the base of the high-side transistor Q10 and the second fixed voltage terminal PVee. The control signal dre is input to the base of the control transistor Q20. On the other hand, the control transistor Q21 is arranged in series with the first bias current source 36 between the base of the low-side transistor Q11 and the first fixed voltage terminal PVcc. An inverted control signal xdre is input to the base of the control transistor Q21. The symbol "x" represents logical inversion.

When the control signal dre is negated (set to low level), both the transistors Q20 and Q21 are turned on, which turns off both the high-side transistor Q10 and the low-side transistor Q11, thereby setting the output terminal 7 to the high-impedance state.

The transistor Q22 and the transistor Q20 form a pair. The transistor Q22 is arranged in series with the second bias current source 38 between the emitter of the input transistor Q13 and the second fixed voltage terminal PVee. Furthermore, the transistor Q23 and the transistor Q21 form a pair. The transistor Q23 is arranged in series with the first bias current source 36 between the emitter of the input transistor Q12 and the first fixed voltage terminal PVcc. When the control signal dre is asserted, the transistors Q22 and Q23 are turned on. In this state, the buffer circuit 30b shown in FIG. 8 is equivalent to the buffer circuit 30 shown in FIG. 4.

The transistors Q24 and Q25 and the diodes D1 and D2 are provided in order to expand the output voltage range. For example, in a case in which the base voltage (Vee+a) to be applied to the transistor Q24 is set to 8.1 V and the base voltage (Vcc−a) to be applied to the transistor Q25 is set to −3.1 V, and with the forward voltage of each diode and the base-emitter voltage of each bipolar transistor estimated to be 0.7 V, such an arrangement provides an output voltage range of −1 V to 6 V.

The bias current generating circuit monitors the control voltage dre, in addition to the input signal IN. Upon detecting an edge in the control signal dre, the bias current generating circuit boosts the first bias current source 36 and the second bias current source 38, thereby increasing the currents that flow through the control transistors Q20 and Q21.

Such a modification is capable of performing high speed switching of the high-impedance state.

[Fourth Modification]

A fourth modification relates to a driver circuit having a high-voltage output function. The state of the driver circuit is configured to be switchable between a first state in which the voltage to be output is switched between multiple voltages (vil, vih) according to the input signal IN and a third state in which a high voltage VHH is output. The state is switched between the first state and the third state according to a control signal cnth (not shown).

In addition to the buffer circuit shown in FIG. 8, the driver circuit further includes a separate high-voltage buffer having a configuration including high-voltage-resistant elements. When the control signal cnth is asserted, the high-voltage buffer is set to the enable state, and when the control signal cnth is negated, the high-voltage buffer is set to the high-impedance state.

By monitoring the control signal cnth, and by boosting the bias current to be supplied to the high-voltage buffer for a predetermined period of time after an edge of the control signal cnth, such a modification is capable of high-speed switching between the first state and the third state.

[Fifth Embodiment]

A fifth embodiment relates to a driver circuit including a pre-emphasis function. The pre-emphasis function represents a function of boosting the amount of change in the output voltage at a timing of a transition in the level signal sig. By jointly employing the pre-emphasis function and the aforementioned boost function for boosting the bias current, such a modification provides high-speed transmission.

[Sixth Modification]

With a sixth modification, in addition to the bias current to be supplied to the buffer circuit 30, the bias current to be supplied to the level switch circuit 20 provided as an upstream component is also boosted. Such a modification can be expected to provide a further increase in the operating speed.

[Seventh Modification]

Description has been made in the embodiment regarding an arrangement in which the bias current generating circuit detects an edge in the input signal IN. However, the present invention is not restricted to such an arrangement. Also, a modification may be made in which the state in which the input signal IN exhibits a constant value is detected so as to generate the variable component i_dyn. For example, an arrangement wherein the period in which the input signal IN is flat is measured using a reference clock signal can also be suitably employed to control the bias current i_bias.

The "driver circuit" described in the present specification is a broad concept which also includes comparators and operational amplifiers, which are also encompassed in the technical scope of the present invention. Furthermore, the "driver circuit" concept includes various circuits including the buffer circuit shown in FIG. 4 or a similar buffer circuit as an output stage.

Also, any combinations of the above-described embodiment and modifications are also effective as the present invention.

While the preferred embodiments of the present invention have been described using specific terms, such description is for illustrative purposes only, and it is to be understood that changes and variations may be made without departing from the spirit or scope of the appended claims.

What is claimed is:

1. A driver circuit comprising:
a level switch circuit configured to receive a digital input signal, and to generate a level signal having a voltage level that corresponds to the value of the aforementioned input signal;
a buffer circuit configured to receive the level signal, and to output the level signal thus received; and
a bias current generating circuit configured to generate a bias current including a DC component having a constant level and a variable component that changes according to the input signal, and to supply the bias current thus generated to the buffer circuit.

2. A driver circuit according to claim 1, wherein the bias current generating circuit detects an edge in the input signal, and raises the bias current by a predetermined amount for a predetermined period of time after the edge thus detected.

3. A driver circuit according to claim 2, wherein the bias current generating circuit comprises:
a DC bias current source configured to generate the DC component;
an edge detection circuit configured to detect an edge in the input signal, and to generate a variable signal which is asserted for a predetermined period of time after the edge thus detected;
a pulse current generating circuit configured to convert the variable signal into a current, thereby generating the variable component; and
a current combining unit configured to combine the variable component and the DC component.

4. A driver circuit according to claim 1, wherein the buffer circuit comprises an emitter follower push-pull output stage including a PNP high-side transistor and an NPN low-side transistor,
and wherein the bias current generating circuit raises the bias current to be supplied to a base of the high-side transistor by a predetermined amount for a predetermined period of time after a positive edge in the input signal,
and wherein the bias current generating circuit raises the bias current to be supplied to a base of the low-side transistor by a predetermined amount for a predetermined period of time after a negative edge in the input signal.

5. A driver circuit according to claim 4, wherein the bias current generating circuit comprises:
a DC bias current source configured to generate the DC component;
a first edge detection circuit configured to detect a positive edge of the input signal, and to generate a first variable signal which is asserted for a predetermined first period after the positive edge thus detected;
a first pulse current generating circuit configured to convert the first variable signal into a current, thereby generating a first variable component;
a first current combining unit configured to combine the first variable component and the DC component;
a second edge detection circuit configured to detect a negative edge of the input signal, and to generate a second variable signal which is asserted for a predetermined second period after the negative edge thus detected;
a second pulse current generating circuit configured to convert the second variable signal into a current, thereby generating a second variable component; and
a second current combining unit configured to combine the second variable component and the DC component.

6. A driver circuit according to claim 1, wherein the buffer circuit comprises:
an emitter follower push-pull output stage including a PNP high-side transistor and an NPN low-side transistor;
a first control transistor arranged between a base of the high-side transistor and a lower fixed voltage;
a second control transistor arranged between a base of the low-side transistor and an upper fixed voltage,
and wherein the buffer circuit is configured to be switchable to a high-impedance state by turning on both the first and second control transistors,
and wherein the driver circuit is configured to monitor an enable signal which is used for switching the high-impedance state, and to change the currents that flow through the first and second control transistors upon detection of an edge in the enable signal.

7. A driver circuit according to claim 1, wherein the bias current generating circuit is configured to detect a state in which the input signal exhibits a constant value, and thereby to generate the variable component.

8. A test apparatus comprising:
a pattern generator configured to generate a pattern signal to be supplied to a device under test; and
a driver circuit according to claim 1, configured to receive the pattern signal, and to output the pattern signal thus received to the device under test.

9. A driver circuit comprising:
a level switch circuit configured to receive a digital input signal, and to generate a level signal having a voltage level that corresponds to the value of the aforementioned input signal;
a buffer circuit configured to receive the level signal, and to output the level signal thus received; and
a bias current generating circuit configured to generate a bias current including a DC component having a constant level and a variable component that changes according to the input signal, and to supply the bias current thus generated to the buffer circuit,
wherein a slew rate of the outputted level signal is according to the bias current supplied to the buffer circuit.

10. A driver circuit comprising:
a level switch circuit configured to receive a digital input signal, and to generate a level signal having a voltage level that corresponds to the value of the aforementioned input signal;
a buffer circuit configured to receive the level signal, and to output the level signal thus received; and
a bias current generating circuit configured to generate a bias current including a DC component having a constant level and a variable component that changes according to the input signal, and to supply the bias current thus generated to the buffer circuit,
wherein the buffer circuit comprises an emitter follower push-pull output stage including a PNP high-side transistor and an NPN low-side transistor,
wherein the bias current generating circuit raises the bias current to be supplied to a base of the high-side transistor by a predetermined amount for a predetermined period of time after a positive edge in the input signal, and
wherein the bias current generating circuit raises the bias current to be supplied to a base of the low-side transistor by a predetermined amount for a predetermined period of time after a negative edge in the input signal.

11. A driver circuit according to claim 10, wherein the bias current generating circuit comprises:
a DC bias current source configured to generate the DC component;
a first edge detection circuit configured to detect a positive edge of the input signal, and to generate a first variable signal which is asserted for a predetermined first period after the positive edge thus detected;
a first pulse current generating circuit configured to convert the first variable signal into a current, thereby generating a first variable component;
a first current combining unit configured to combine the first variable component and the DC component;
a second edge detection circuit configured to detect a negative edge of the input signal, and to generate a second variable signal which is asserted for a predetermined second period after the negative edge thus detected;

a second pulse current generating circuit configured to convert the second variable signal into a current, thereby generating a second variable component; and a second current combining unit configured to combine the second variable component and the DC component.

12. A driver circuit comprising:

a level switch circuit configured to receive a digital input signal, and to generate a level signal having a voltage level that corresponds to the value of the aforementioned input signal;

a buffer circuit configured to receive the level signal, and to output the level signal thus received, the buffer circuit comprising:

an emitter follower push-pull output stage including a PNP high-side transistor and an NPN low-side transistor;

a first control transistor arranged between a base of the high-side transistor and a lower fixed voltage; and a second control transistor arranged between a base of the low-side transistor and an upper fixed voltage;

a bias current generating circuit configured to generate a bias current including a DC component having a constant level and a variable component that changes according to the input signal, and to supply the bias current thus generated to the buffer circuit, wherein the buffer circuit is configured to be switchable to a high-impedance state by turning on both the first and second control transistors, and wherein the driver circuit is configured to monitor an enable signal which is used for switching the high-impedance state, and to change the currents that flow through the first and second control transistors upon detection of an edge in the enable signal.

* * * * *